US012753055B2

(12) United States Patent
Liu et al.

(10) Patent No.: US 12,753,055 B2
(45) Date of Patent: Oct. 6, 2026

(54) TRANSPORT APPARATUS, BATTERY TEST SYSTEM, AND BATTERY PRODUCTION SYSTEM

(71) Applicant: CONTEMPORARY AMPEREX TECHNOLOGY CO., LIMITED, Ningde (CN)

(72) Inventors: Bo Liu, Ningde (CN); Guolong Liao, Ningde (CN); Lixin Guo, Ningde (CN); Yankun Li, Ningde (CN); Haiyang Li, Ningde (CN); Shaoteng Ren, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 19/303,040

(22) Filed: Aug. 18, 2025

(65) Prior Publication Data

US 2025/0382165 A1 Dec. 18, 2025

Related U.S. Application Data

(63) Continuation of application No. PCT/CN2023/120403, filed on Sep. 21, 2023.

(30) Foreign Application Priority Data

Apr. 17, 2023 (CN) ........................ 202320856859.7

(51) Int. Cl.

| | |
|---|---|
| ***B66F 9/12*** | (2006.01) |
| ***B66F 9/06*** | (2006.01) |
| ***B66F 9/24*** | (2006.01) |
| ***G01R 31/36*** | (2020.01) |
| ***H01M 10/42*** | (2006.01) |

(52) U.S. Cl.

CPC .............. *B66F 9/063* (2013.01); *B66F 9/122* (2013.01); *B66F 9/24* (2013.01); *G01R 31/3644* (2013.01); *H01M 10/4285* (2013.01)

(58) Field of Classification Search

None

See application file for complete search history.

(56) References Cited

U.S. PATENT DOCUMENTS

| | | | | |
|---|---|---|---|---|
| 10,913,641 | B2 * | 2/2021 | Gravelle | B66F 9/122 |
| 11,396,424 | B2 * | 7/2022 | Cheng | B25J 13/08 |

(Continued)

FOREIGN PATENT DOCUMENTS

| | | | |
|---|---|---|---|
| CN | 108363395 | A | 8/2018 |
| CN | 207903264 | U | 9/2018 |

(Continued)

OTHER PUBLICATIONS

Machine translation of CN213386553 from Espacenet. (Year: 2021).*

(Continued)

*Primary Examiner* — Mark C Hageman

(74) *Attorney, Agent, or Firm* — ANOVA LAW GROUP, PLLC

(57) ABSTRACT

A transport apparatus comprises: a vehicle body; and a handling module which is provided on the vehicle body and comprises a base, an insertion arm extendably/retractably provided on the base, and a limiting member, the insertion arm having, in its own extension/retraction direction, a connection section and an insertion and pickup section which are opposite to each other, the connection section being extendably/retractably connected to the base, the insertion and pickup section being located at the front end of the extension direction of the connection section, and the limiting member being provided on the surface of the insertion arm facing away from the base, wherein the limiting member is located between the connection section and the insertion and pickup section, and a bearing space for placing a material is defined between the limiting member and the insertion and pickup section.

15 Claims, 4 Drawing Sheets

(56) References Cited

U.S. PATENT DOCUMENTS

| | | | | |
|---|---|---|---|---|
| 11,449,059 | B2 * | 9/2022 | Arandorenko | G05D 1/0214 |
| 11,945,649 | B2 * | 4/2024 | Galluzzo | B65G 1/1375 |
| 12,145,827 | B2 * | 11/2024 | Faimali | B66F 9/063 |
| 2021/0395007 | A1 * | 12/2021 | Galluzzo | B65G 1/1371 |
| 2022/0089420 | A1 | 3/2022 | Faimali et al. | |
| 2022/0259023 | A1 * | 8/2022 | Iwamoto | B65G 1/0435 |
| 2022/0274779 | A1 * | 9/2022 | Qian | B65G 1/0435 |
| 2022/0332555 | A1 * | 10/2022 | Schiavi | B66F 9/142 |
| 2022/0416286 | A1 | 12/2022 | Park et al. | |

FOREIGN PATENT DOCUMENTS

| | | | |
|---|---|---|---|
| CN | 111137808 | A | 5/2020 |
| CN | 111137812 | A | 5/2020 |
| CN | 213171340 | U | 5/2021 |
| CN | 112875128 | A | 6/2021 |
| CN | 213386553 | U | 6/2021 |
| CN | 114380241 | A | 4/2022 |
| CN | 216888416 | U | 7/2022 |
| EP | 3909888 | A1 | 11/2021 |
| EP | 4005948 | A1 | 6/2022 |
| WO | 2019027396 | A2 | 2/2019 |

OTHER PUBLICATIONS

The World Intellectual Property Organization (WIPO) International Search Report for PCT/CN2023/120403 Nov. 24, 2023 6 Pages (including translation).

The European Patent Office (EPO) The Extended European Search Report for Application No. 23933710.8 Jun. 25, 2026 25 Pages.

* cited by examiner

TRANSPORT APPARATUS, BATTERY TEST SYSTEM, AND BATTERY PRODUCTION SYSTEM

CROSS-REFERENCE TO RELATED APPLICATION

The present application is a continuation of International Application No. PCT/CN2023/120403, filed on Sep. 21, 2023, which claims priority to Chinese Patent Application No. 202320856859.7 entitled “TRANSPORT APPARATUS, BATTERY TEST SYSTEM, AND BATTERY PRODUCTION SYSTEM” filed on Apr. 17, 2023, which are incorporated herein by reference in their entirety.

TECHNICAL FIELD

The present application relates to the technical field of batteries, and in particular, to a transport apparatus, a battery test system, and a battery production system.

BACKGROUND

Energy conservation and emission reduction are the key to sustainable development of the automobile industry. Electric vehicles have become an important part of the sustainable development of the automobile industry due to their energy-saving and environmental protection advantages. For electric vehicles, the battery technology is an important factor in their development, and is also crucial to the testing of batteries.

With the rapid development of the lithium battery industry, the testing volume and types in lithium battery laboratories have increased significantly. Traditional laboratories rely on manual loading and unloading by operators, resulting in low efficiency.

SUMMARY

In view of this, the present application provides a transport apparatus, a battery test system, and a battery production system.

In a first aspect, the present application provides a transport apparatus. The transport apparatus includes:

a vehicle body; and a handling module, arranged on the vehicle body, and including a base, an insertion arm extendably/retractably arranged on the base, and a limiting member, where the insertion arm is provided with a connecting segment and an insertion and pickup segment opposite to each other in an extension/retraction direction of the insertion arm, the connecting segment is extendably/retractably connected to the base, and the insertion and pickup segment is located at a front end of the connecting segment in an extension direction; and the limiting member is arranged on a surface of the insertion arm facing away from the base;

where the limiting member is located between the connecting segment and the insertion and pickup segment, and a carrying space for placing a material is defined between the limiting member and the insertion and pickup segment.

In the technical solutions of the embodiments of the present application, the vehicle body of the transport apparatus can drive the handling module to move to a designated position for handling operations. When the insertion arm in the handling module picks up the material by insertion, the insertion arm gradually extends into the bottom of the material, the insertion arm gradually carries the material, and the material gradually enters the carrying space defined between the insertion arm and the limiting member and gradually approaches the limiting member. Subsequently, if the insertion arm continues to extend forward, the material will abut against the limiting member. In this way, the material is prevented from exceeding the carrying space under the blocking of the limiting member, and the material can be limited in the carrying space each time the material is picked up by insertion, thereby improving the consistency of material pickup. Therefore, when the material is a battery to be tested, by using the transport apparatus, the accuracy of battery transportation can be improved, thus ensuring accurate placement of the battery for testing. In this way, the accuracy of battery testing is improved.

In some embodiments, the limiting member is provided with a limiting surface facing the carrying space, and an end of the limiting surface distal to the insertion arm is obliquely arranged toward a direction facing away from the carrying space.

In the technical solutions of the embodiments of the present application, the obliquely arranged limiting surface provides a buffer space for the material, preventing the material from being damaged due to excessive impact force between the material and the limiting member. In addition, after the material slides in an obliquely upward direction on the limiting surface for buffering, the material can slide downward into the carrying space under the action of its own gravity. This ensures that the material can finally fall back to the carrying space, thereby improving the positional consistency of the material on the insertion arm.

In some embodiments, the handling module further includes a material pickup detection sensor, the material pickup detection sensor being arranged on the insertion arm and configured to detect whether the material reaches a designated position of the carrying space.

In the technical solutions of the embodiments of the present application, in the process of the insertion arm gradually extending below the material, the material gradually extends into the carrying space. When the material fully extends into the carrying space and moves into place, the material pickup detection sensor can be triggered, such that the material pickup detection sensor sends a signal indicating that the insertion arm should stop extending, thereby preventing the material pickup effect from being affected by the excessive extension length of the insertion arm.

In some embodiments, the material pickup detection sensor is an optical sensor, configured to emit detection light, and further configured to receive the reflected light reflected by the material after the material at the material storage position is inserted into the carrying space.

In the technical solutions of the embodiments of the present application, in the process of the insertion arm gradually extending forward below the material, the material gradually extends into the carrying space until the material fully enters the carrying space. When the material moves into place, the detection light emitted by a first emitter is blocked by the material, forming reflected light. Consequently, the first receiver can receive the reflected light. In this case, the material pickup detection sensor is triggered, and the material pickup detection sensor sends a signal for controlling the insertion arm to stop extending outward, thereby preventing the excessive extension length of the insertion arm and ensuring effective material pickup.

In some embodiments, the material pickup detection sensor is arranged corresponding to the limiting member, and at least a portion of the material pickup detection sensor faces the carrying space.

In some embodiments, the handling module further includes an extension/retraction obstacle avoidance sensor, the extension/retraction obstacle avoidance sensor being arranged on the insertion arm and configured to detect whether an obstacle is present on an extension path of the insertion arm.

In the technical solutions of the embodiments of the present application, during the insertion process of the insertion arm into the bottom space of the material, if the extension/retraction obstacle avoidance sensor detects that an obstacle is present in front of the insertion arm, the extension/retraction obstacle avoidance sensor can send a signal in time to control the insertion arm to stop moving, thereby preventing the insertion arm from colliding with the obstacle in front, and preventing the insertion arm from being damaged.

In some embodiments, the extension/retraction obstacle avoidance sensor is an optical sensor, configured to emit light along the extension path of the insertion arm, and further configured to receive the reflected light reflected by the obstacle on the extension path of the insertion arm.

In the technical solutions of the embodiments of the present application, the extension/retraction obstacle avoidance sensor emits the detection light to the front of the insertion arm. In the process in which the insertion arm extends forward, if an obstacle is present on the extension path, the obstacle can block and reflect the detection light. Subsequently, the extension/retraction obstacle avoidance sensor can receive the reflected light, such that the extension/retraction obstacle avoidance sensor is triggered to send a signal for controlling the insertion arm to stop moving, thereby preventing the insertion arm from colliding with the obstacle in front to protect the insertion arm.

In some embodiments, the handling module further includes a material placement detection sensor, the material placement detection sensor being arranged on the insertion arm and configured to detect whether the carrying space is aligned with a material placement position during an extension/retraction process of the insertion arm.

In the technical solutions of the embodiments of the present application, during the material placement process, the material needs to be accurately placed at the material placement position. Therefore, the material placement detection sensor is used to detect whether the carrying space is aligned with the material placement position. When the carrying space is aligned with the material placement position, it indicates that the insertion arm moves into place, and in this case, the material placement action can be performed, thereby improving the accuracy of the material placement.

In some embodiments, the material placement detection sensor is an optical sensor, and the material placement detection sensor is configured to emit detection light, and is further configured to receive the reflected light reflected by a mating member at the material placement position when the carrying space is aligned with the material placement position.

In the technical solutions of the embodiments of the present application, in the material placement process, the insertion arm carries the material and gradually extends toward a direction close to the material placement position until the carrying space carrying the material is aligned with the material placement position, i.e., when the carrying space and the material are right above the material placement position, the detection light emitted by the material placement detection sensor can be blocked and reflected by the mating member at the material placement position. As a result, the material placement detection sensor can receive the reflected light, and the material placement detection sensor is triggered to send a signal for controlling the insertion arm to stop extending/retracting, thereby improving the accuracy of the material placement.

In some embodiments, the material placement detection sensor is arranged on an outer side wall of the connecting segment, so as to prevent the material placement detection sensor from affecting material pickup by the insertion and pickup segment.

In some embodiments, the transport apparatus further includes several ground obstacle avoidance sensors, all the ground obstacle avoidance sensors being arranged on the vehicle body and configured to detect whether an obstacle is present within the moving range of the vehicle body.

In the technical solutions of the embodiments of the present application, during the movement process of the vehicle body, the ground obstacle avoidance sensor can be used to detect whether an obstacle is present around the vehicle body, to prevent collisions with the obstacle during the movement process of the vehicle body and avoid damage to the vehicle body.

In some embodiments, the base is liftable along a first direction and is rotatably arranged on the vehicle body around the first direction, and the insertion arm is extendably/retractably arranged on the base along a direction intersecting the first direction.

In the technical solutions of the embodiments of the present application, in the process of picking up and placing the material, the base can drive the insertion arm to ascend, descend, and rotate according to needs, enabling the insertion arm to flexibly adjust its position in three-dimensional space, thereby moving to a required position.

In some embodiments, the transport apparatus further includes a lifting driving member and a rotation driving member, the lifting driving member being arranged on the vehicle body, the rotation driving member being arranged on the lifting driving member and being driven by the lifting driving member to ascend/descend along the first direction, and the base being arranged on the rotation driving member and rotating around the first direction under an action of the rotation driving member.

In some embodiments, the transport apparatus further includes a goods shelf, the goods shelf being arranged on the vehicle body and provided with a plurality of layers of storage positions along the first direction.

In the technical solutions of the embodiments of the present application, a plurality of materials can be stored at one time by means of the goods shelf, such that the plurality of materials can be transported, thereby improving handling efficiency of the materials.

In some embodiments, the transport apparatus further includes a top obstacle avoidance sensor, the top obstacle avoidance sensor being arranged at a top end of the goods shelf and configured to detect whether an obstacle is present on a forward path of the goods shelf.

In the technical solutions of the embodiments of the present application, the goods shelf is provided with a plurality of layers of storage positions along the first direction. As the goods shelf is relatively high, during the movement process, the goods shelf may collide with an obstacle at the top part. Therefore, by using the top obstacle avoidance sensor to detect the obstacle on the forward path of the goods shelf, collisions of the relatively high goods shelf can be prevented, thereby protecting the goods shelf.

In a second aspect, the present application provides a battery test system. The battery test system includes a battery test apparatus and the transport apparatus described above, where the transport apparatus is configured to transfer the material to the battery test apparatus.

In a third aspect, the present application provides a battery production system. The battery production system includes the battery test system described above.

The above description is only an overview of the technical solutions of the present application. To more clearly understand the technical means of the present application to enable implementation in accordance with the content of the specification and to make the above and other purposes, features, and advantages of the present application more obvious and easy to understand, the detailed description of the present application is provided below.

Figure 1:
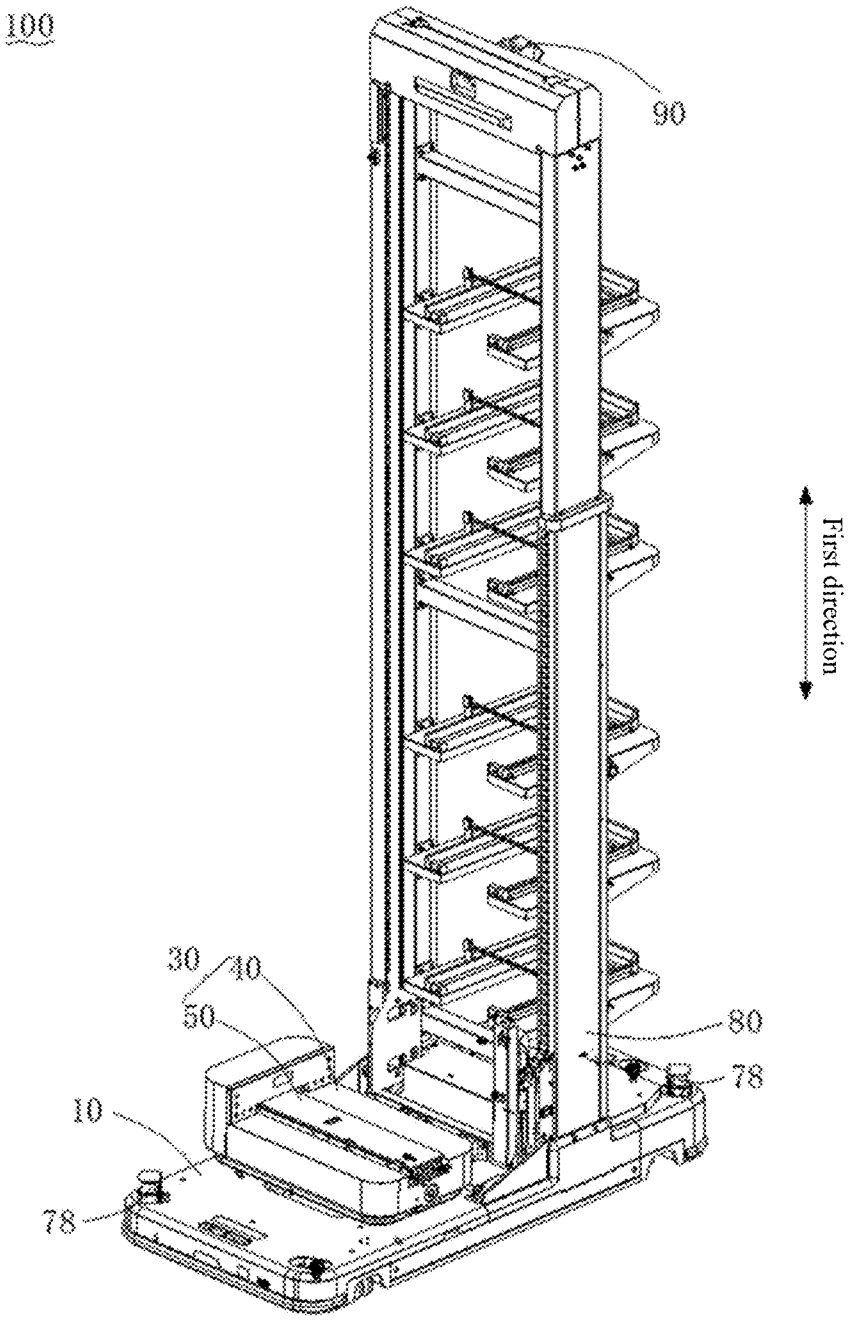
FIG. 1 is a schematic structural diagram of a transport apparatus according to an embodiment of the present application.

Description of the reference numerals: 100, transport apparatus; 10, vehicle body; 30, handling module; 40, base; 50, insertion arm; 52, insertion and pickup segment; 54, connecting segment; 60, limiting member; 61, carrying space; 62, limiting surface; 72, material placement detection sensor; 74, material pickup detection sensor; 76, extension/retraction obstacle avoidance sensor; 78, ground obstacle avoidance sensor; 80, goods shelf, 90, top obstacle avoidance sensor; 200, carrying goods shelf; 210, mating member; 300, material.

DETAILED DESCRIPTION

Embodiments of the technical solutions of the present application will be described in detail below with reference to the drawings. The following embodiments are only used to more clearly illustrate the technical solutions of the present application, and therefore, are only exemplary and do not limit the claimed scope of the present application.

Unless otherwise defined, all technical and scientific terms used herein have the same meaning as commonly understood by those skilled in the technical field to which the present application belongs. The terms used herein are only used to illustrate the specific embodiments, rather than limit the present application. The terms "include", "comprise", and "provided with", and any variations thereof in the description and claims of the present application and the above drawing description encompass non-exclusive inclusions.

In the description of the embodiments of the present application, technical terms such as "first", "second", and the like are only used to distinguish different objects and should not be interpreted as indicating or implying the relative importance or implicitly indicating the number, specific order, or primary and secondary relationship of the noted technical features. In the description of the embodiments of the present application, unless otherwise specifically defined, "plurality of" means two or more.

Reference in the present application to "embodiment" means that a particular feature, structure, or characteristic described in combination with the embodiment can be included in at least one embodiment of the present application. The references of the word in the context of the specification do not necessarily refer to the same embodiment, nor to separate or alternative embodiments exclusive of other embodiments. It will be explicitly and implicitly appreciated by those skilled in the art that the embodiments described herein can be combined with other embodiments.

In the description of the embodiments of the present application, the term "and/or" is merely a way to describe the associative relationship between associated objects, indicating that there are three possible relationships. For example, "A and/or B" may denote: the presence of A alone, the simultaneous presence of A and B, and the presence of B alone. In addition, the character "/" herein generally indicates an "or" relationship between the associated objects before and after the "/".

In the description of the embodiments of the present application, the term "plurality of" refers to two or more (including two). Similarly, "plurality of groups" refers to two or more (including two) groups, and "plurality of pieces" refers to two or more (including two) pieces.

In the description of the embodiments of the present application, the technical terms "center", "longitudinal", "transverse", "length", "width", "thickness", "upper", "lower", "front", "rear", "left", "right", "vertical", "horizontal", "top", "bottom", "inner", "outer", "clockwise" "counterclockwise", "axial", "radial", "circumferential" and the like indicate orientations or positional relationships based on those shown in the drawings. They are merely for the convenience of describing the present application and simplifying the description, rather than indicating or implying that the apparatus or element referred to must have a specific orientation or be constructed and operated in the specific orientation, and thus should not be construed as a limitation to the present application.

In the description of the embodiments of the present application, unless otherwise clearly specified and defined, the technical terms "mount", "interconnect", "connect", "fix", and the like should be interpreted in their broad senses. For example, they may be a fixed connection, a detachable connection, or an integral connection; a mechanical connection or an electrical connection; or a direct connection, an indirect connection via an intermediate, a communication between interiors of two elements, or an interaction between two elements. For those of ordinary skill in the art, the specific meanings of the above terms in the embodiments of the present application can be interpreted according to specific conditions.

At present, judging from the trends in the market, the application of power batteries is becoming increasingly widespread. Power batteries are not only applied in energy storage power systems such as hydropower, thermal power, wind power and solar power stations, but are also widely applied in electric transportation vehicles such as electric bicycles, electric motorcycles, and electric cars, and other fields. With the continuous expansion of the application field of power batteries, the market demand for power batteries is also constantly increasing.

In an unmanned laboratory, battery performance is tested by a battery test device. Batteries are automatically transported by a transport apparatus, and the batteries are transported to a detection place for performance detection. Generally, the transport apparatus is an automated guided vehicle (AGV) that can automatically travel to a designated place according to a set route, and then automatically load/unload batteries without manual handling, effectively improving the battery loading/unloading efficiency and reducing the potential safety risk associated with personnel actions.

When the transport apparatus picks up the material, the transport apparatus moves part of its structure to carry the battery, and drive the battery out of the storage position to complete the material pickup. However, when the transport apparatus carries the battery, the movement precision of the transport apparatus is limited, resulting in positional deviations in multiple battery carrying and poor material pickup consistency, thereby affecting the accuracy of subsequent battery transportation and detection.

To solve the problem of positional inconsistencies in multiple material pickups, a limiting member can be arranged at a preset position of the insertion arm. During the insertion process of the insertion arm into the bottom of the battery, the limiting block is located on one side of the battery, and the two gradually approach each other. If the insertion arm extends excessively, the battery can be restricted to a fixed position under the blocking of the limiting block, preventing deviation in the position where the battery is carried, thereby improving material pickup consistency.

Figure 2:
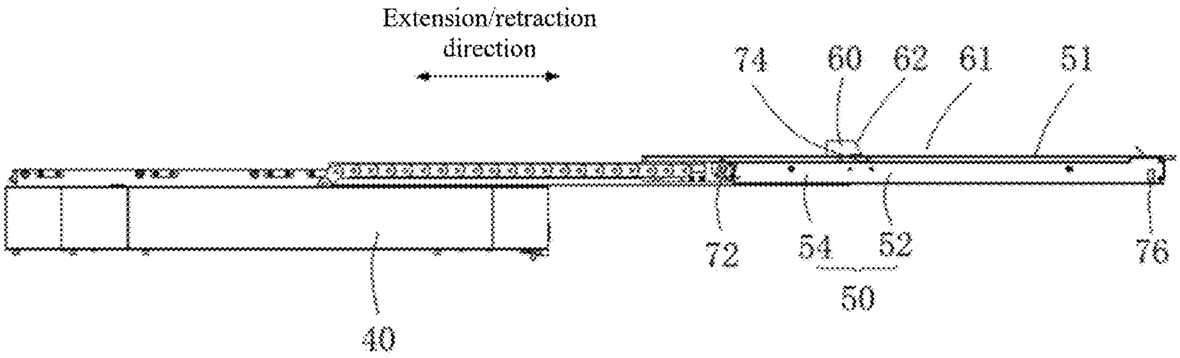
FIG. 2 is a schematic structural diagram of a handling module in the transport apparatus shown in FIG. 1 from one perspective.
Figure 3:
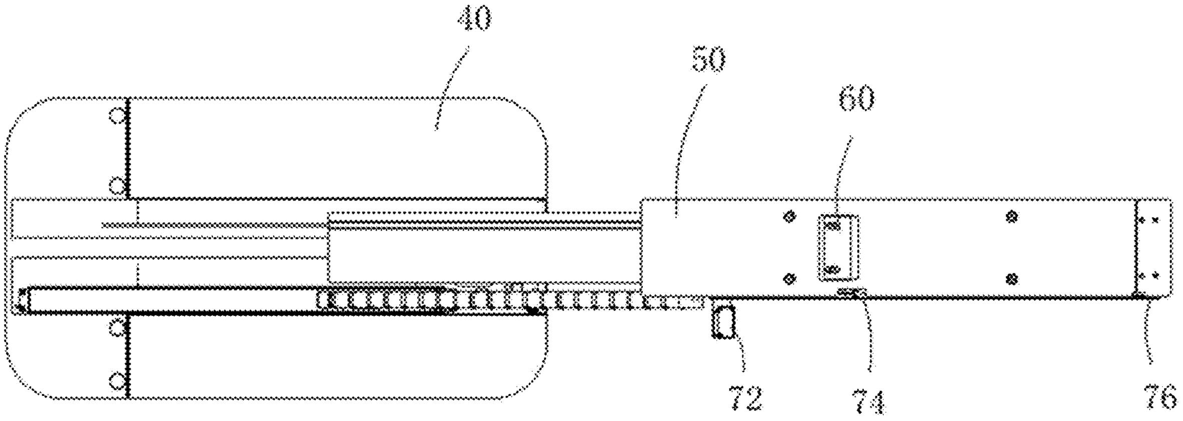
FIG. 3 is a schematic structural diagram of the handling module shown in FIG. 2 from another perspective.

According to some embodiments of the present application, referring to FIGS. 1 to 3, FIG. 1 shows a transport apparatus 100 according to some embodiments of the present application. FIG. 2 is a schematic structural diagram of a handling module 30 in the transport apparatus 100 shown in FIG. 1 from one perspective. FIG. 3 is a schematic structural diagram of the handling module 30 shown in FIG. 2 from another perspective. The present application provides a transport apparatus 100. The transport apparatus includes a vehicle body 10 and a handling module 30, where the handling module 30 is arranged on the vehicle body 10, and includes a base 40, an insertion arm 50 extendably/retractably arranged on the base 40, and a limiting member 60, where the insertion arm 50 is provided with a connecting segment 54 and an insertion and pickup segment 52 that are opposite to each other in an extension/retraction direction of the insertion arm, the connecting segment 54 is extendably/retractably connected to the base 40, and the insertion and pickup segment 52 is located at the front end of the connecting segment 54 in the extension direction; and the limiting member 60 is arranged on the surface of the insertion arm 50 facing away from the base 40; where the limiting member 60 is located between the connecting segment 54 and the insertion and pickup segment 52, and a carrying space 61 for placing a material 300 is defined between the limiting member 60 and the insertion and pickup segment 52.

The vehicle body 10 is a component that can automatically travel and move, so as to drive the transport apparatus 100 to move as a whole to a designated position. The vehicle body 10 includes, but is not limited to, a shell, a driving member, and wheels. The wheels are driven by the driving member to rotate and drive the vehicle body 10 to move.

The handling module 30 is a component capable of automatically transporting and transferring the material 300, and is configured to transport the material 300 from a storage position to a material placement position. The handling module 30 may first transport and transfer the material 300 from the storage position to the vehicle body 10, and then transport and transfer the material 300 from the vehicle body 10 to the material placement position. Alternatively, the handling module 30 directly transports the material 300 from the storage position to the material placement position without intermediate transit on the vehicle body 10.

The insertion arm 50 is an extendable/retractable structural member, and is configured to pick and place the material 300. The connecting segment 54 of the insertion arm 50 is a part extendably/retractably connected to the base 40, and is configured to drive the entire insertion arm 50 to extend/retract. The insertion and pickup segment 52 is a part configured to pick up the material 300 by insertion. Driven by the connecting segment 54, the insertion and pickup segment protrudes from or retracts to the base 40 to pick up the material 300 by insertion. When picking up the material 300 by insertion, the insertion and pickup segment 52 of the insertion arm 50 gradually extends into the bottom of the material 300 to gradually carry the material 300. After the material 300 is carried into place, the insertion arm 50 drives the material 300 and retracts synchronously with the material, such that the material 300 can depart from the storage position and the insertion and pickup of the material 300 are completed. When placing the material 300, the insertion arm 50 carries the material 300 and moves synchronously above a preset position, and then the insertion arm 50 descends synchronously with the material 300, such that the material 300 is supported on the carrying goods shelf 200 at the preset position. Finally, the insertion arm 50 retracts and moves out of the carrying goods shelf 200, and meanwhile, the material 300 remains on the carrying goods shelf 200, thereby completing the placement of the material 300.

The limiting member 60 refers to a structural member that limits and blocks the material 300 in the carrying space 61. The limiting member 60 is arranged between the connecting segment 54 and the insertion and pickup segment 52. In this way, when the insertion and pickup segment 52 of the insertion arm 50 gradually extends into the bottom of the material 300, the limiting member 60 gradually approaches the side surface of the material 300. The material 300 is blocked by the limiting member 60 to prevent relatively excessive movement of the material 300 on the insertion arm 50.

The carrying space 61 refers to a space defined between the insertion and pickup segment 52 of the insertion arm 50 and the limiting member 60 for bearing the material 300. Located on the outer side of the extension/retraction direction of the insertion arm 50, the carrying space can be aligned with the external material 300 for material pickup during the extension/retraction of the insertion arm 50.

In the above transport apparatus 100, the vehicle body 10 can drive the handling module 30 to move to a designated position for handling operations. When the insertion arm 50 in the handling module 30 picks up the material 300 by insertion, the insertion and pickup segment 52 of the insertion arm 50 gradually extends into the bottom of the material 300, the insertion and pickup segment 52 gradually carries the material 300, and the material 300 gradually enters the carrying space 61 defined between the insertion and pickup segment 52 and the limiting member 60 and gradually approaches the limiting member 60. Subsequently, if the insertion arm 50 continues to extend forward, the material 300 will abut against the limiting member 60. In this way, the material 300 is prevented from exceeding the carrying space 61 under the blocking of the limiting member 60, and the material 300 can be limited in the carrying space 61 each time the material 300 is picked up by insertion, thereby improving the consistency of material pickup. Therefore, when the material 300 is a battery to be tested, by using the transport apparatus 100, the accuracy of battery transportation can be improved, ensuring accurate placement of the battery for testing, thereby improving the accuracy of battery testing.

According to some embodiments of the present application, the base 40 is liftable along a first direction and is rotatably arranged on the vehicle body 10 around the first direction, and the insertion arm 50 is extendably/retractably arranged on the base 40 along a direction intersecting the first direction.

The first direction intersects with the extension/retraction direction of the insertion arm, and an intersecting included angle may be 60 degrees to 90 degrees. In some embodiments, the first direction is perpendicular to the extension/retraction direction of the insertion arm, and an included angle between the two directions is 90 degrees. From a perspective shown in FIG. 1, the first direction is a vertical direction in this figure.

In the process of picking up and placing the material 300, the base 40 can drive the insertion arm 50 to ascend, descend, and rotate according to needs, enabling the insertion arm 50 to flexibly adjust its position in three-dimensional space, thereby moving to a required position.

Further, the transport apparatus 100 further includes a lifting driving member and a rotation driving member, the lifting driving member being arranged on the vehicle body 10, the rotation driving member being arranged on the lifting driving member and being driven by the lifting driving member to ascend/descend along the first direction, and the base 40 being arranged on the rotation driving member and rotating around the first direction under the action of the rotation driving member.

In this way, when the lifting driving member works, the lifting driving member can drive the rotation driving member and the handling module 30 to ascend or descend along the first direction. When the rotation driving member works, the rotation driving member can drive the handling module 30 to rotate around the first direction, such that the insertion arm 50 of the handling module 30 rotates to a required position. Through the cooperation of the lifting driving member and the rotation driving member, the handling module 30 can move flexibly in the three-dimensional space to transport the material 300.

According to some embodiments of the present application, the limiting member 60 is provided with a limiting surface 62 facing the carrying space 61, and an end of the limiting surface 62 distal to the insertion arm 50 is obliquely arranged toward a direction facing away from the carrying space 61. In this way, after the material 300 abuts against the limiting member 60 in the carrying space 61, the material can slide in an obliquely upward direction along the limiting surface 62, and finally slide downward along the surface into the carrying space 61 under the action of its own gravity. In this way, the obliquely arranged limiting surface 62 provides a buffer space for the material 300, preventing the material 300 from being damaged due to excessive impact force between the material 300 and the limiting member 60. In addition, after the material 300 slides in an obliquely upward direction on the limiting surface 62 for buffering, the material can slide downward into the carrying space 61 under the action of its own gravity. This ensures that the material 300 can finally fall back to the carrying space 61, thereby improving the positional consistency of the material 300 on the insertion arm 50.

According to some embodiments of the present application, the handling module 30 further includes a material pickup detection sensor 74, the material pickup detection sensor 74 being arranged on the insertion arm 50 and configured to detect whether the material 300 reaches a designated position of the carrying space 61.

The designated position refers to a position at which the material fully enters the carrying space 61 when the material is picked up by insertion. In the process in which the insertion and pickup segment of the insertion arm moves forward at the bottom of the material and the material gradually enters the carrying space 61, when the material fully enters the carrying space 61 and the material is inserted into place, the material reaches the designated position within the carrying space 61. Specifically, the designated position is the position of the limiting surface. Taking the side surface of the front end of the material facing the carrying space 61 as the reference position, when the reference position reaches the designated position, it can be considered that the material has fully entered the carrying space 61.

In the process of the insertion arm 50 gradually extending below the material 300, the material 300 gradually extends into the carrying space 61. When the material 300 fully extends into the carrying space 61 and moves into place, the material pickup detection sensor 74 can be triggered, such that the material pickup detection sensor 74 sends a signal indicating that the insertion arm 50 should stop extending, thereby preventing the material pickup effect from being affected by the excessive extension length of the insertion arm 50.

Further, the material pickup detection sensor 74 is an optical sensor, configured to emit detection light, and further configured to receive the reflected light reflected by the material 300 after the material 300 at the material storage position enters the carrying space 61 in place.

Specifically, the material pickup detection sensor 74 is arranged corresponding to the limiting member 60, and at least a portion of the material pickup detection sensor 74 faces the carrying space 61. As such, the material pickup detection sensor 74 is arranged at an end of the carrying space 61 proximal to the limiting member 60 and corresponds to the designated position of the material 300. When the material 300 moves to the designated position, it means that the material 300 moves into place, and in this case, the material pickup detection sensor 74 is triggered. Moreover, at least a portion of the material pickup detection sensor 74 faces the carrying space 61, and can emit and receive light into/from the interior of the carrying space 61 to perform the corresponding detection.

Specifically, at least a portion of the material pickup detection sensor 74 protrudes beyond the top surface of the insertion arm 50, such that at least a portion of the material pickup detection sensor 74 faces the carrying space 61 to detect light emission and reflected light reception.

In the process of the insertion arm 50 gradually extending forward below the material 300, the material 300 gradually extends into the carrying space 61. When the material 300 does not extend into place, the light emitted by the material pickup detection sensor 74 directly passes through the carrying space 61 to the external environment without forming reflected light. As the material pickup detection sensor 74 cannot receive the reflected light, in this case, the material pickup detection sensor 74 is not triggered. Until the material 300 fully enters the carrying space 61, when the material 300 moves into place, the detection light emitted by the material pickup detection sensor 74 is blocked by the material 300, forming reflected light. Consequently, the material pickup detection sensor 74 can receive the reflected light. In this case, the material pickup detection sensor 74 is triggered, and the material pickup detection sensor 74 sends a signal for controlling the insertion arm 50 to stop extending outward, thereby preventing the excessive extension length of the insertion arm 50 and ensuring effective material pickup.

Optionally, the direction in which the material pickup detection sensor 74 emits the light intersects with the extension/retraction direction of the insertion arm 50. Specifically, in the embodiment shown in FIG. 1, the material pickup detection sensor 74 emits the light upward, and when the material 300 moves into place, the light emitted upward is blocked and reflected by the material 300.

According to some embodiments of the present application, the handling module 30 further includes an extension/retraction obstacle avoidance sensor 76, the extension/retraction obstacle avoidance sensor 76 being arranged on the insertion arm 50 and configured to detect whether an obstacle is present on the extension path of the insertion arm 50.

The extension/retraction obstacle avoidance sensor 76 is configured to detect an obstacle. For example, the extension/retraction obstacle avoidance sensor 76 is an optical sensor, a camera, or other detecting members, as long as the detection member can specifically identify the obstacle. For example, the extension/retraction obstacle avoidance sensor 76 is arranged on the insertion and pickup segment 52 of the insertion arm 50, or arranged on the connecting segment 54 of the insertion arm 50. In some embodiments, the extension/retraction obstacle avoidance sensor 76 is arranged at the front end of the insertion and pickup segment 52 distal to the connecting segment 54. If an obstacle is present at the front end of the insertion and pickup segment 52, the extension/retraction obstacle avoidance sensor 76 can detect the obstacle in time.

During the insertion process of the insertion arm 50 into the bottom space of the material 300, if the extension/retraction obstacle avoidance sensor 76 detects that an obstacle is present in front of the insertion arm 50, the extension/retraction obstacle avoidance sensor can send a signal in time to control the insertion arm 50 to stop moving, thereby preventing the insertion arm 50 from colliding with the obstacle in front, and thus preventing the insertion arm 50 from being damaged.

Further, the extension/retraction obstacle avoidance sensor 76 is an optical sensor, configured to emit detection light along the extension path of the insertion arm 50, and further configured to receive the reflected light reflected by the obstacle on the extension path of the insertion arm 50.

That is, the extension/retraction obstacle avoidance sensor 76 emits the detection light to the front of the insertion arm 50. In the process in which the insertion arm 50 extends forward, if an obstacle is present on the extension path, the obstacle can block and reflect the detection light. Subsequently, the extension/retraction obstacle avoidance sensor 76 can receive the reflected light, triggering the extension/retraction obstacle avoidance sensor 76 to send a signal for controlling the insertion arm 50 to stop moving, thereby preventing the insertion arm 50 from colliding with the obstacle in front to protect the insertion arm 50.

Optionally, the extension/retraction obstacle avoidance sensor 76 is arranged on a side surface of the front end of the insertion arm 50, which does not occupy space on the carrying surface, and does not affect the insertion and pickup of the material 300.

Figure 4:
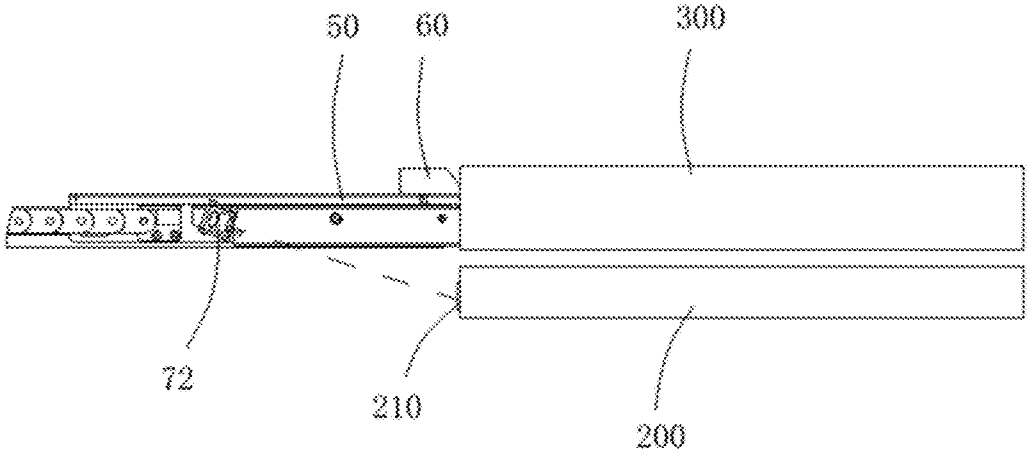
FIG. 4 is a schematic structural diagram of the handling module in the transport apparatus shown in FIG. 1 when placing the material.

Referring to FIGS. 2 to 4, according to some embodiments of the present application, the handling module 30 further includes a material placement detection sensor 72, the material placement detection sensor 72 being arranged on the insertion arm 50 and configured to detect whether the carrying space 61 is aligned with the material placement position during the extension/retraction process of the insertion arm 50, such that the material 300 can be accurately placed at the material placement position.

Specifically, the insertion arm 50 moves toward the bottom of the material 300, allowing the material 300 to enter the carrying space 61 on the insertion arm 50. After the material pickup action is completed, the transport apparatus 100 moves to another position to perform the material placement action. During the material placement process, the material 300 needs to be accurately placed at the material placement position. Therefore, the material placement detection sensor 72 is used to detect whether the carrying space 61 is aligned with the material placement position. When the carrying space 61 is aligned with the material placement position, it indicates that the insertion arm 50 moves into place, and in this case, the material placement action can be performed, thereby improving the accuracy of the material placement.

Further, the material placement detection sensor 72 is an optical sensor, configured to emit detection light, and further configured to receive the reflected light reflected by a mating member 210 at the material placement position when the carrying space 61 is aligned with the material placement position.

In the material placement process, the insertion arm 50 carries the material 300 and gradually extends toward a direction close to the material placement position until the carrying space 61 carrying the material 300 is aligned with the material placement position, i.e., when the carrying space 61 and the material 300 are right above the material placement position, the detection light emitted by the material placement detection sensor 72 can be blocked and reflected by the mating member 210 at the material placement position. As a result, the material placement detection sensor 72 can receive the reflected light, and the material placement detection sensor 72 is triggered to send a signal for controlling the insertion arm 50 to stop extending/retracting, thereby improving the accuracy of the material placement. Subsequently, the insertion arm 50 can move downward to carry the material 300 to the material placement position. Finally, the insertion arm 50 retracts vertically downward from the material 300 to complete the material placement action.

Optionally, the external environment is provided with a carrying goods shelf 200 that is provided with a material placement position. The front end of the carrying goods shelf 200 is provided with a mating member 210. When the insertion arm 50 moves forward into place, the mating member 210 is located on a propagation path of the detection light emitted by the material placement detection sensor 72, enabling the material placement detection sensor 72 to be triggered. In a specific embodiment, during the movement process of the insertion arm 50, the carrying goods shelf 200 is located below the insertion arm 50, and the material placement detection sensor 72 emits obliquely downward light. When the insertion arm 50 moves into place and the material on the insertion arm 50 is aligned with the material placement position on the carrying goods shelf 200, the mating member 210 on the carrying goods shelf 200 obliquely below the material placement detection sensor 72 can reflect the detection light, thereby triggering the material placement detection sensor 72.

Specifically, the material placement detection sensor 72 is arranged on an outer side wall of the connecting segment 54 of the insertion arm 50, which does not affect the insertion and pickup of the material 300 by the insertion and pickup segment 52.

Referring to FIG. 1, according to some embodiments of the present application, the transport apparatus 100 further includes several ground obstacle avoidance sensors 78, all the ground obstacle avoidance sensors 78 being arranged on the vehicle body 10 and configured to detect whether an obstacle is present within the moving range of the vehicle body 10. For example, two ground obstacle avoidance sensors 78 are included. The two ground obstacle avoidance sensors 78 are respectively arranged on two diagonally opposite corners of the vehicle body 10 along a diagonal direction of the vehicle body 10. Each ground obstacle avoidance sensor 78 is responsible for detecting a semicircular range of the vehicle body 10. In this way, the combination of the two ground obstacle avoidance sensors 78 enables full-coverage obstacle detection. It can be understood that the number of the ground obstacle avoidance sensors 78 may also be set to other values, as long as they can cover the entire outer circumferential range of the vehicle body 10 during the movement process of the vehicle body 10.

In this way, during the movement process of the vehicle body 10, the ground obstacle avoidance sensor 78 can be used to detect whether an obstacle is present around the vehicle body 10, to prevent collisions with the obstacle during the movement process of the vehicle body and avoid damage to the vehicle body 10.

Further, the transport apparatus 100 includes two ground obstacle avoidance sensors 78. The two ground obstacle avoidance sensors 78 are oppositely spaced apart along the diagonal direction of the vehicle body 10 and are arranged on the vehicle body 10. The detection range of each ground obstacle avoidance sensor 78 is sector-shaped, and when combined, they can effectively detect the overall surrounding range of the vehicle body 10.

Optionally, the ground obstacle avoidance sensor 78 is an optical sensor capable of emitting a sector-shaped beam, with the detection range being the range covered by the sector-shaped beam, e.g., a detection range of 120 degrees to 130 degrees. Specifically, during the movement process of the vehicle body 10, if an obstacle is present on the ground in front of the vehicle body 10, a certain ground obstacle avoidance sensor 78 can be triggered to control the vehicle body 10 to stop moving; and when the vehicle body 10 turns, if an obstacle is present on the turning path of the vehicle body 10, a certain ground obstacle avoidance sensor 78 can be triggered to control the vehicle body 10 to stop moving.

According to some embodiments of the present application, the transport apparatus 100 further includes a goods shelf 80. The goods shelf 80 is arranged on the vehicle body 10 and provided with a plurality of layers of storage positions along the first direction. A plurality of materials 300 can be stored at one time by means of the goods shelf 80, such that the plurality of materials 300 can be transported, thereby improving the handling efficiency of the materials 300.

Specifically, the transport apparatus 100 first moves to a designated position where the materials 300 are stored, and a plurality of materials 300 are sequentially transported by the handling module to the plurality of layers of storage positions. Then, the transport apparatus 100 starts to travel and move, and after reaching a detection position, the handling module sequentially transports the plurality of materials 300 to material placement positions. In this way, the transport apparatus 100 efficiently and automatically transports the materials 300, thereby implementing automatic detection of the battery.

According to some embodiments of the present application, the transport apparatus 100 further includes a top obstacle avoidance sensor 90, the top obstacle avoidance sensor 90 being arranged at the top end of the goods shelf 80 and configured to detect whether an obstacle is present on the forward path of the goods shelf 80. The goods shelf 80 is provided with a plurality of layers of storage positions along the first direction. As the goods shelf 80 is relatively high, during the movement process, the goods shelf may collide with an obstacle at the top part. Therefore, by using the top obstacle avoidance sensor 90 to detect the obstacle on the forward path of the goods shelf 80, collisions of the relatively high goods shelf 80 can be prevented, thereby protecting the goods shelf 80.

Further, the detection direction of the top obstacle avoidance sensor 90 is obliquely downward, such that the detection range of the top obstacle avoidance sensor 90 covers a relatively large area of the top end of the goods shelf 80, thereby preventing the goods shelf 80 from colliding with the obstacle at the top part. Optionally, the top obstacle avoidance sensor 90 is an optical sensor emitting a sector-shaped beam.

According to some embodiments of the present application, the present application provides a transport apparatus 100. The transport apparatus 100 includes a vehicle body 10 and a handling module 30. The handling module 30 is arranged on the vehicle body 10, the vehicle body 10 is configured to drive the transport apparatus 100 to move and travel, and the handling module 30 is configured to transport a material 300. Specifically, the handling module 30 includes a base 40, an insertion arm 50, and a limiting member 60. The base 40 is liftable and rotatably arranged on the vehicle body 10, and the insertion arm 50 is extendably/retractably arranged on the base 40. In this way, through the cooperation and movement of the base 40 and the insertion arm 50, the insertion arm 50 can move flexibly in the three-dimensional space to pick up and place the material 300. Meanwhile, the insertion arm 50 is provided with a limiting member 60. In the process of the insertion arm 50 extending forward at the bottom of the material 300, the material 300 moves relative to the insertion arm 50 proximal to the limiting member 60. Under the blocking of the limiting member 60, the material 300 can be blocked in the carrying space 61 to prevent the material 300 from excessive movement, thereby improving the material pickup consistency, and preventing relatively large positional discrepancies in multiple material pickups.

Moreover, the handling module 30 further includes a material pickup detection sensor 74, an extension/retraction obstacle avoidance sensor 76, and a material placement detection sensor 72 all arranged on the insertion arm 50, where the material pickup detection sensor 74 is configured to detect whether the material 300 moves into place within the carrying space 61, thereby further improving the material pickup consistency; the extension/retraction obstacle avoidance sensor 76 is configured to detect whether an obstacle is present on the extension path of the insertion arm 50, thereby preventing the insertion arm 50 from colliding with an obstacle in front during the extension process for material pickup, to protect the insertion arm 50; and the material placement detection sensor 72 is configured to detect whether the carrying space 61 is aligned with the material placement position, to accurately place the material 300 at the material placement position, thereby improving the material placement accuracy.

According to some embodiments of the present application, a specific process of the transport apparatus 100 transporting a material 300 is as follows:

Firstly, the transport apparatus 100 moves to a material storage position driven by the vehicle body 10. The handling module 30 moves to correspond to the storage position, and the insertion arm 50 extends forward, such that the insertion and pickup segment 52 gradually extends into the bottom of the material 300 and gradually carries the material 300 until the material 300 moves to the designated position of the carrying space 61. The material pickup detection sensor 74 is triggered, and the insertion arm 50 stops moving. Meanwhile, the limiting member 60 blocks one side of the material 300 to prevent excessive extension of the insertion arm 50, which causes the material 300 to deviate from the designated position, thereby ensuring the consistency of the material pickup.

Subsequently, when the transport apparatus 100 moves to the next position driven by the vehicle body 10 to place the material, the insertion arm 50 carries the material 300 to move above the carrying goods shelf 200, and a certain gap between the material 300 and the carrying goods shelf 200 is maintained, which facilitates the forward movement of the insertion arm 50 and the material 300, until the material 300 is aligned with the material placement position on the carrying goods shelf 200. In this case, the material placement detection sensor 72 is triggered, and the insertion arm 50 stops extending forward. Then, the insertion arm 50 descends synchronously with the material 300, such that the material 300 is supported on the carrying goods shelf 200. Finally, the insertion arm 50 retracts and moves out of the carrying goods shelf 200, and meanwhile, the material 300 remains on the carrying goods shelf 200, thereby completing the placement of the material 300.

According to some embodiments of the present application, the present application further provides a battery test system. The battery test system includes a battery test apparatus and the transport apparatus 100 according to any one of the above embodiments, where the transport apparatus 100 is configured to transfer the material 300 to the battery test apparatus to test the performance of the material 300 (a battery). The battery test apparatus can be used to detect the performance of the battery at different ambient temperatures, or can be used to detect other performance of the battery, e.g., the safety performance and cycle life of the battery. The battery test system may further include, but is not limited to, other test devices, a goods shelf 80, and the like. The battery test system may be an unmanned automatic test laboratory, and can automatically complete a full set of tests on a battery.

According to some embodiments of the present application, the present application further provides a battery production system configured to produce and manufacture batteries. The battery production system includes the above battery test system, and may further include, but is not limited to, an assembly device for assembling battery cells, a winding device for winding electrode plates, a stacking device for stacking the electrode plates, a die-cutting device/slitting device for cutting the electrode plates, and the like.

The technical features of the above embodiments may be arbitrarily combined. For the sake of concise description, not all possible combinations of the technical features in the above embodiments have been described. However, as long as there is no contradiction between the combinations of these technical features, they should be considered as falling within the scope of the specification.

The above embodiments represent only several implementations of the present application, and the description thereof is specific and detailed, but should not be understood as limiting the patent scope of the present application. It should be noted that various changes and modifications can be made by those of ordinary skill in the art without departing from the concept of the present application, and these changes and modifications all shall fall within the protection scope of the present application. Therefore, the scope of protection of the patent in the present application shall be subject to the appended claims.

What is claimed is:

1. A transport apparatus, comprising:

a vehicle body; and a handling module, arranged on the vehicle body, and comprising a base, an insertion arm extendably/retractably arranged on the base, and a limiting member, wherein the insertion arm is provided with a connecting segment and an insertion and pickup segment opposite to each other in an extension/retraction direction of the insertion arm, the connecting segment is extendably/retractably connected to the base, and the insertion and pickup segment is located at a front end of the connecting segment in an extension direction, and the limiting member protrudes at an oblique angle from a carrying surface of the insertion arm facing away from the base, the carrying surface of the insertion arm is configured to support a material from below;

wherein the limiting member is located between the connecting segment and the insertion and pickup segment, and a carrying space for placing the material is defined between the limiting member and the insertion and pickup segment, the carrying space is located on an outer side of an extension/retraction direction of the insertion arm and is positioned such that, when the insertion and pickup segment extends into a bottom space of the material and carries the material, the material gradually enters the carrying space and approaches the limiting member.

2. The transport apparatus according to claim 1, wherein the limiting member is provided with a limiting surface facing the carrying space, an end of the limiting surface distal to the insertion arm is obliquely arranged toward a direction facing away from the carrying space, and after the material abuts against the limiting surface, the material slides in an obliquely upward direction along the limiting surface and then slides downward along the limiting surface into the carrying space under gravity.

3. The transport apparatus according to claim 1, wherein the handling module further comprises a material pickup detection sensor, the material pickup detection sensor being arranged on the insertion arm and configured to detect whether the material reaches a designated position of the carrying space.

4. The transport apparatus according to claim 3, wherein the material pickup detection sensor is an optical sensor, and the material pickup detection sensor is configured to emit detection light, and is further configured to receive reflected light reflected by the material after the material at a material storage position is inserted into the carrying space.

5. The transport apparatus according to claim 3, wherein the material pickup detection sensor is arranged corresponding to the limiting member, and at least a portion of the material pickup detection sensor faces the carrying space.

6. The transport apparatus according to claim 1, wherein the handling module further comprises an extension/retraction obstacle avoidance sensor, the extension/retraction obstacle avoidance sensor being arranged on the insertion arm and configured to detect whether an obstacle is present on an extension path of the insertion arm.

7. The transport apparatus according to claim 6, wherein the extension/retraction obstacle avoidance sensor is an optical sensor, configured to emit light along the extension path of the insertion arm, and further configured to receive reflected light reflected by an obstacle on the extension path of the insertion arm.

8. The transport apparatus according to claim 1, wherein the handling module further comprises a material placement detection sensor, the material placement detection sensor being arranged on the insertion arm and configured to detect whether the carrying space is aligned with a material placement position during an extension/retraction process of the insertion arm.

9. The transport apparatus according to claim 8, wherein the material placement detection sensor is an optical sensor, and the material placement detection sensor is configured to emit detection light, and is further configured to receive reflected light reflected by a mating member at the material placement position when the carrying space is aligned with the material placement position.

10. The transport apparatus according to claim 8, wherein the material placement detection sensor is arranged on an outer side wall of the connecting segment.

11. The transport apparatus according to claim 1, further comprising:

several ground obstacle avoidance sensors, all the ground obstacle avoidance sensors being arranged on the vehicle body and configured to detect whether an obstacle is present within a moving range of the vehicle body.

12. The transport apparatus according to claim 1, wherein the base is liftable along a first direction and is rotatably arranged on the vehicle body around the first direction, and the insertion arm is extendably/retractably arranged on the base along a direction intersecting the first direction.

13. The transport apparatus according to claim 12, further comprising:

a lifting driving member and a rotation driving member, the lifting driving member being arranged on the vehicle body, the rotation driving member being arranged on the lifting driving member and being driven by the lifting driving member to ascend/descend along the first direction, and the base being arranged on the rotation driving member and rotating around the first direction under an action of the rotation driving member.

14. The transport apparatus according to claim 12, further comprising:

a goods shelf, the goods shelf being arranged on the vehicle body and provided with a plurality of layers of storage positions along the first direction.

15. The transport apparatus according to claim 14, further comprising:

a top obstacle avoidance sensor, the top obstacle avoidance sensor being arranged at a top end of the goods shelf and configured to detect whether an obstacle is present on a forward path of the goods shelf.

* * * * *